United States Patent
Urakawa

(10) Patent No.: US 8,232,622 B2
(45) Date of Patent: Jul. 31, 2012

(54) STACKED-CHIP DEVICE

(75) Inventor: Yukihiro Urakawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 185 days.

(21) Appl. No.: 12/546,806

(22) Filed: Aug. 25, 2009

(65) Prior Publication Data

US 2010/0052096 A1  Mar. 4, 2010

(30) Foreign Application Priority Data

Aug. 26, 2008  (JP) ................................. 2008-216823

(51) Int. Cl.
*H01L 27/08* (2006.01)
(52) U.S. Cl. ........ 257/531; 257/686; 257/737; 438/109; 438/613
(58) Field of Classification Search ................... 257/531, 257/686, 737; 438/109, 613
See application file for complete search history.

(56) References Cited

U.S. PATENT DOCUMENTS

| | | | | |
|---|---|---|---|---|
| 1,521,392 | A * | 12/1924 | Robertson | 264/652 |
| 3,551,127 | A * | 12/1970 | Stoll | 65/32.2 |
| 5,881,310 | A * | 3/1999 | Airhart et al. | 710/3 |
| 6,737,743 | B2 | 5/2004 | Urakawa | |
| 7,088,983 | B2 * | 8/2006 | Hikita et al. | 455/333 |
| 7,122,912 | B2 * | 10/2006 | Matsui | 257/797 |
| 7,466,029 | B2 | 12/2008 | Urakawa | |
| 7,492,361 | B2 * | 2/2009 | Kawachi et al. | 345/204 |
| 7,518,692 | B2 * | 4/2009 | Yamazaki et al. | 349/153 |
| 7,554,195 | B2 * | 6/2009 | Zingher et al. | 257/724 |
| 7,746,232 | B2 * | 6/2010 | Hashimoto | 340/572.7 |
| 7,791,167 | B1 * | 9/2010 | Rofougaran | 257/531 |
| 2004/0129450 | A1 * | 7/2004 | Yamazaki et al. | 174/250 |
| 2006/0087883 | A1 * | 4/2006 | Ozguz et al. | 365/185.04 |
| 2006/0148130 | A1 * | 7/2006 | Urakawa | 438/107 |
| 2007/0286190 | A1 * | 12/2007 | Denzel et al. | 370/389 |
| 2007/0289772 | A1 * | 12/2007 | Kuroda et al. | 174/260 |
| 2008/0143379 | A1 * | 6/2008 | Norman | 326/39 |

(Continued)

FOREIGN PATENT DOCUMENTS

JP  2005-228981  8/2005

(Continued)

OTHER PUBLICATIONS

"A 195-Gb/s 1.2-W Inductive Inter-Chip Wireless Superconnect With Transmit Power Control Scheme for 3-D Stacked System in a Package"—Noriyuki et al. IEEE Journal of Solid-State Circuits, vol. 41, No. 1, Jan. 2006.*

(Continued)

*Primary Examiner* — Eugene Lee
*Assistant Examiner* — Mohammed Shamsuzzaman
(74) *Attorney, Agent, or Firm* — Sprinkle IP Law Group

(57) ABSTRACT

A stacked-chip device includes a first inductive chip having a first function, a second inductive chip having a second function different from the first function, which is stacked on the first inductive chip, and a third inductive chip having the second function, which is stacked on the second inductive chip. Each of the first, second and third inductive chips has transmitting inductors which transmit data and receiving inductors which receive data. The transmitting inductors and the receiving inductors are disposed in line symmetry to an axis of symmetry. The axes of symmetry of the first, second and third inductive chips are overlapped. Each of the second and third inductive chips is disposed in upside-down or back to front to the first inductive chip.

8 Claims, 19 Drawing Sheets

U.S. PATENT DOCUMENTS

| | | | |
|---|---|---|---|
| 2008/0258259 A1* | 10/2008 | Osaka et al. | 257/532 |
| 2009/0090995 A1* | 4/2009 | Yang et al. | 257/531 |
| 2009/0196388 A1* | 8/2009 | Fukaishi et al. | 375/360 |
| 2009/0218407 A1* | 9/2009 | Rofougaran | 235/492 |
| 2009/0233546 A1* | 9/2009 | Sasaki et al. | 455/41.1 |
| 2010/0015918 A1* | 1/2010 | Liu et al. | 455/41.1 |
| 2010/0153788 A1* | 6/2010 | Nakagawa | 714/45 |
| 2010/0266295 A1* | 10/2010 | Zheng et al. | 398/201 |
| 2010/0328044 A1* | 12/2010 | Waffenschmidt et al. | 340/10.4 |

FOREIGN PATENT DOCUMENTS

| | | |
|---|---|---|
| JP | 2006-93659 | 4/2006 |
| JP | 2007-251394 | 9/2007 |
| JP | 2008-091627 | 4/2008 |
| WO | WO 2007/029435 A1 | 3/2007 |
| WO | WO 2008/099711 A1 | 8/2008 |
| WO | WO 2009/069532 A1 | 6/2009 |

OTHER PUBLICATIONS

Office Action for Japanese Patent Application 2008-216823 mailed Dec. 7, 2010, with English translation, 7 pgs.

* cited by examiner

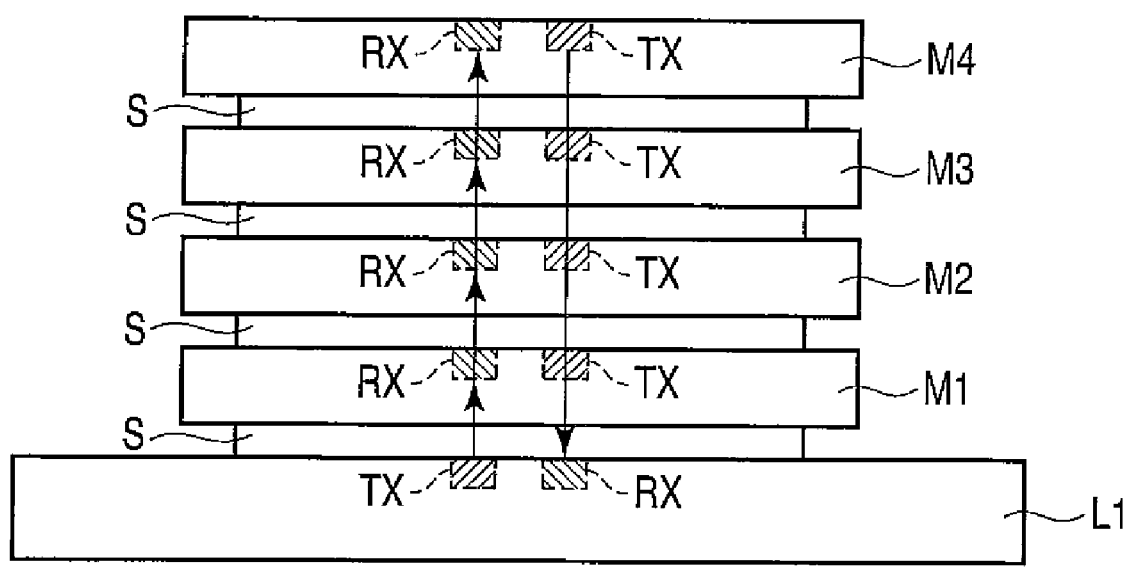
F I G. 2

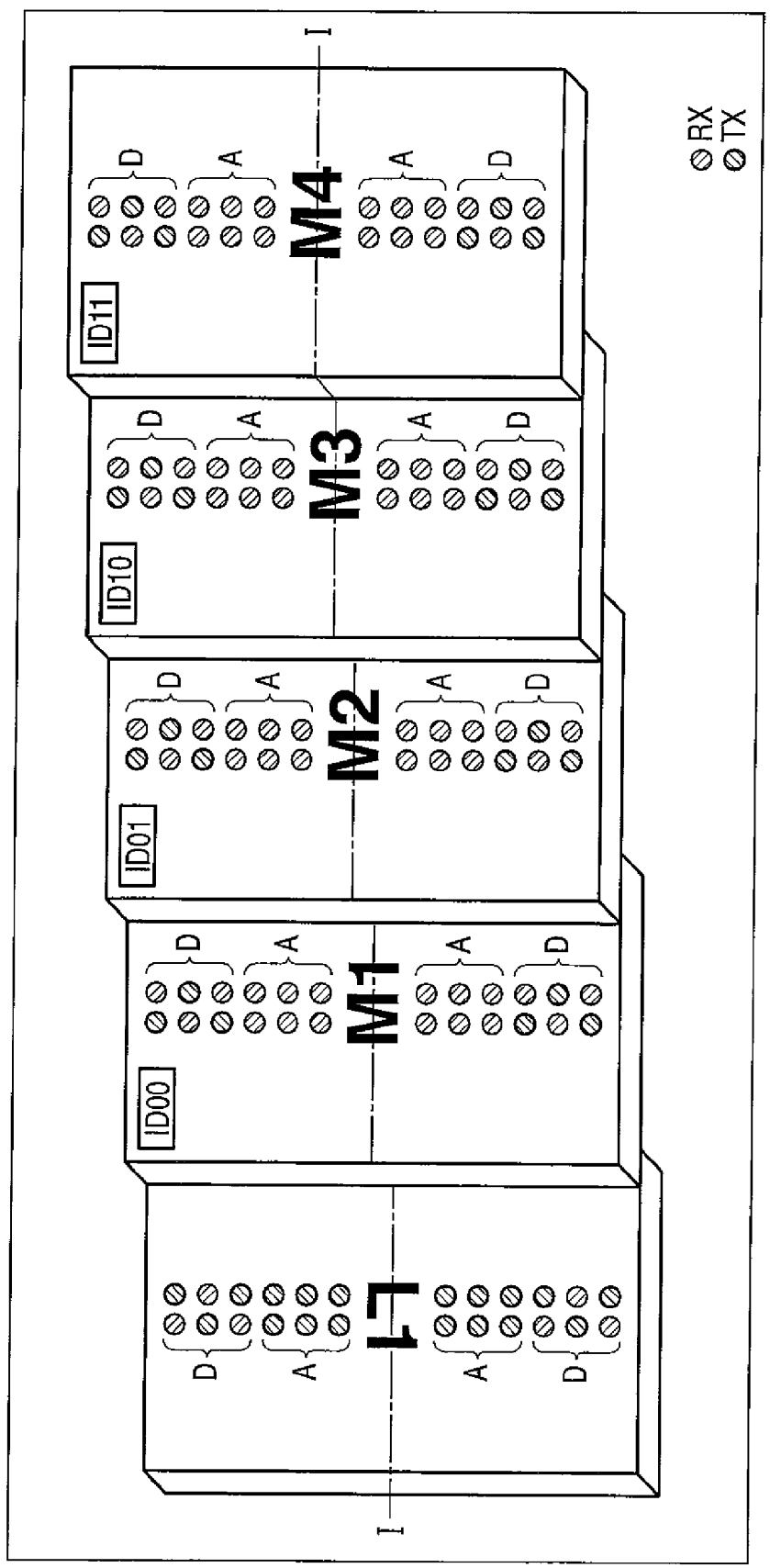
F I G. 8

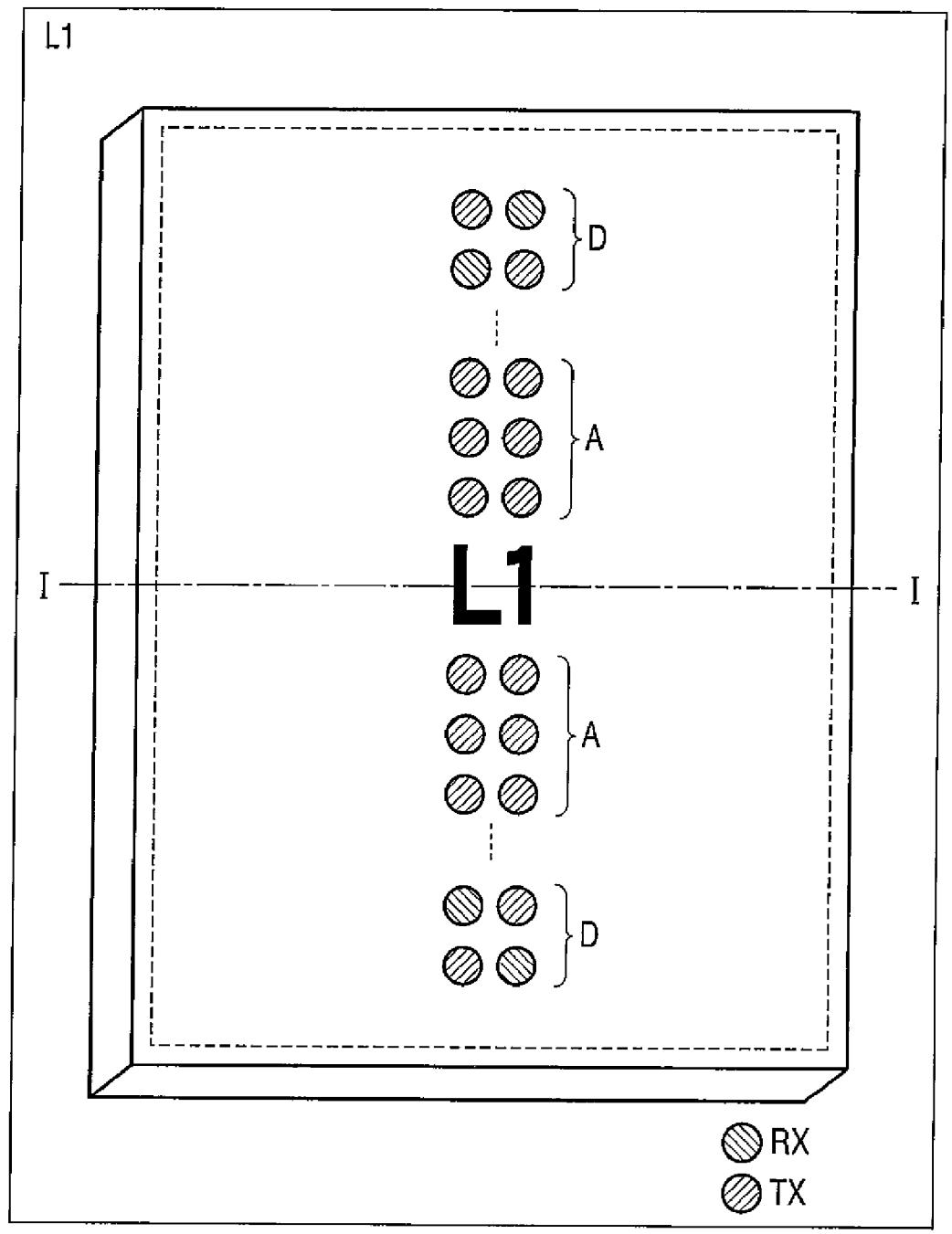
F I G. 13

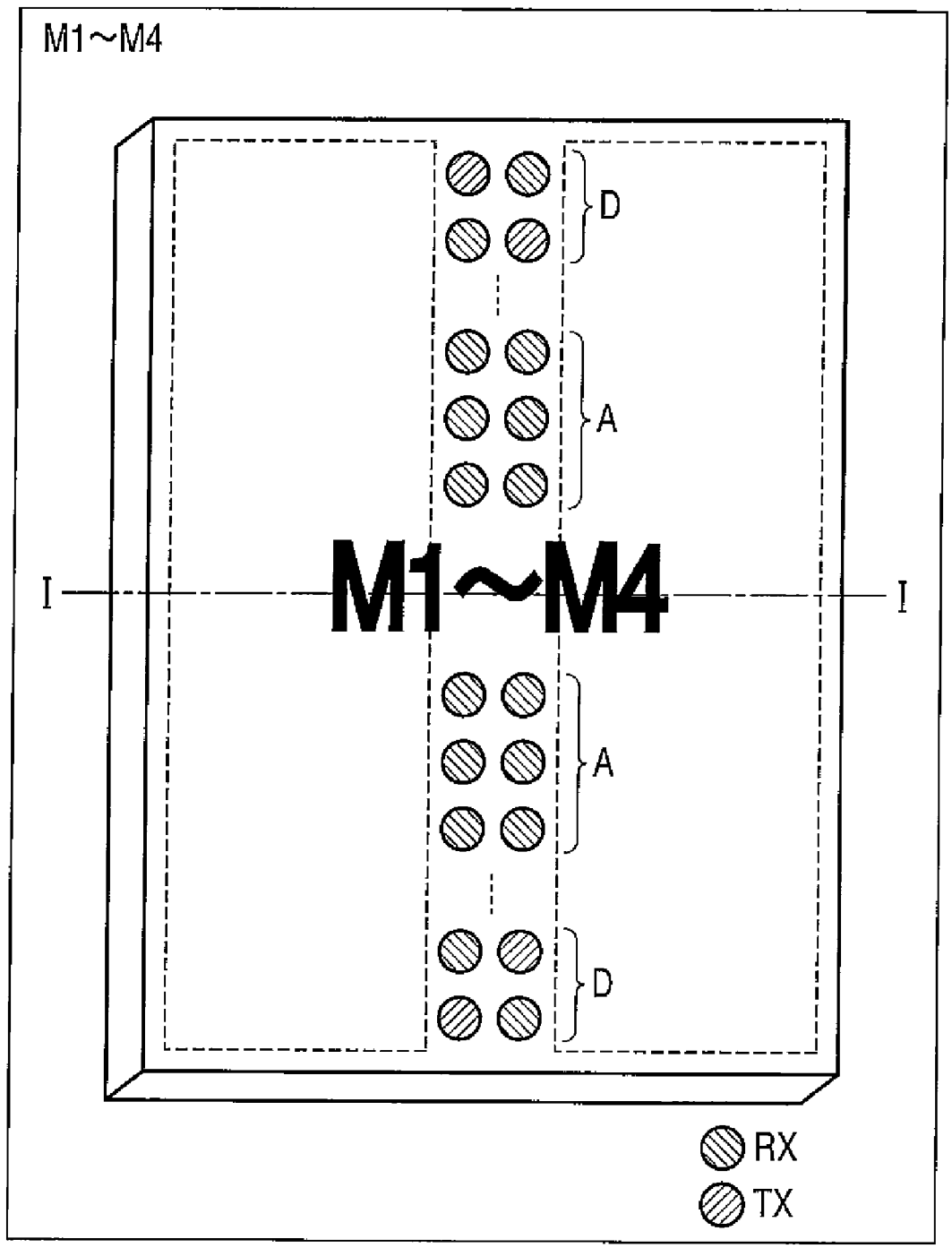
F I G. 14

STACKED-CHIP DEVICE

CROSS-REFERENCE TO RELATED APPLICATIONS

This application is based upon and claims the benefit of priority from prior Japanese Patent Application No. 2008-216823, filed Aug. 26, 2008, the entire contents of which are incorporated herein by reference.

BACKGROUND OF THE INVENTION

1. Field of the Invention

The present invention relates to an inductive chip link technique.

2. Description of the Related Art

A chip-on-chip (CoC) technique is well known as a technique of realizing miniaturization and increased speed of an LSI. In the CoC technique, chips having different functions are stacked and accommodated in a single package.

In CoC, an electrical connection between chips is established by a bump or a bonding wire. One of the problems with CoC is that electrical connections cannot be established by bumps alone when more than two of chips are accommodated in a package, and there are a decrease in performance and an increase in production cost as the number of chips increases.

In order to solve the problem, a technique of transmitting a signal between the stacked chips via radio has been developed as an improved CoC technique (for example, see Jpn. Pat. Appln. KOKAI Publication No. 2005-228981).

In the specification, the technique is referred to as "inductive chip link" (ICL), and a chip used in the technique is referred to as an "inductive chip".

In ICL, for example, because the signal is transmitted between the chips accommodated in a package by electromagnetic induction, even if three or more chips are accommodated in the package/bonding wires are not required to electrically connect the chips. Therefore, there is no decrease in performance or increase in production cost even if the number of chips accommodated in a package is increased.

For this reason, ICL is very promising as a technique applicable to multifunctional electronic devices in the near future.

However, in cases where ICL is applied to an actual product, it is necessary to study specifications, such as radio signal intensity (signal transmission distance), signal transmission path, and layout of transmission/receiving antennas, which are suitable for the product.

BRIEF SUMMARY OF THE INVENTION

A semiconductor device according to an aspect of the present invention comprises transmitting inductors which transmit data, and receiving inductors which receive data. The transmitting inductors and the receiving inductors are disposed in line symmetry.

An stacked-chip device according to an aspect of the present invention comprises a first inductive chip having a first function, a second inductive chip having a second function different from the first function, which is stacked on the first inductive chip, and a third inductive chip having the second function, which is stacked on the second inductive chip. Each of the first, second and third inductive chips has transmitting inductors which transmit data and receiving inductors which receive data. The transmitting inductors and the receiving inductors are disposed in line symmetry to an axis of symmetry. The axes of symmetry of the first, second and third inductive chips are overlapped. Each of the second and third inductive chips is disposed in upside-down or back to front to the first inductive chip.

An stacked-chip device according to an aspect of the present invention comprises a first inductive chip having a first function, a second inductive chip having a second function different from the first function, which is stacked on the first inductive chip, and a third inductive chip having the second function, which is stacked on the second inductive chip. Each of the first, second and third inductive chips has transmitting inductors which transmit data and receiving inductors which receive data. The transmitting inductors and the receiving inductors are disposed in line symmetry to an axis of symmetry. The axes of symmetry of the first, second and third inductive chips are overlapped. The second inductive chip is disposed in upside-down or back to front to the first and third inductive chips.

BRIEF DESCRIPTION OF THE SEVERAL VIEWS OF THE DRAWING

FIG. 2 shows ICL of a first embodiment;
FIG. 8 shows ICL of a second embodiment;
FIGS. 13 and 14 show inductive chips of a fourth embodiment.

DETAILED DESCRIPTION OF THE INVENTION

Figure 1:
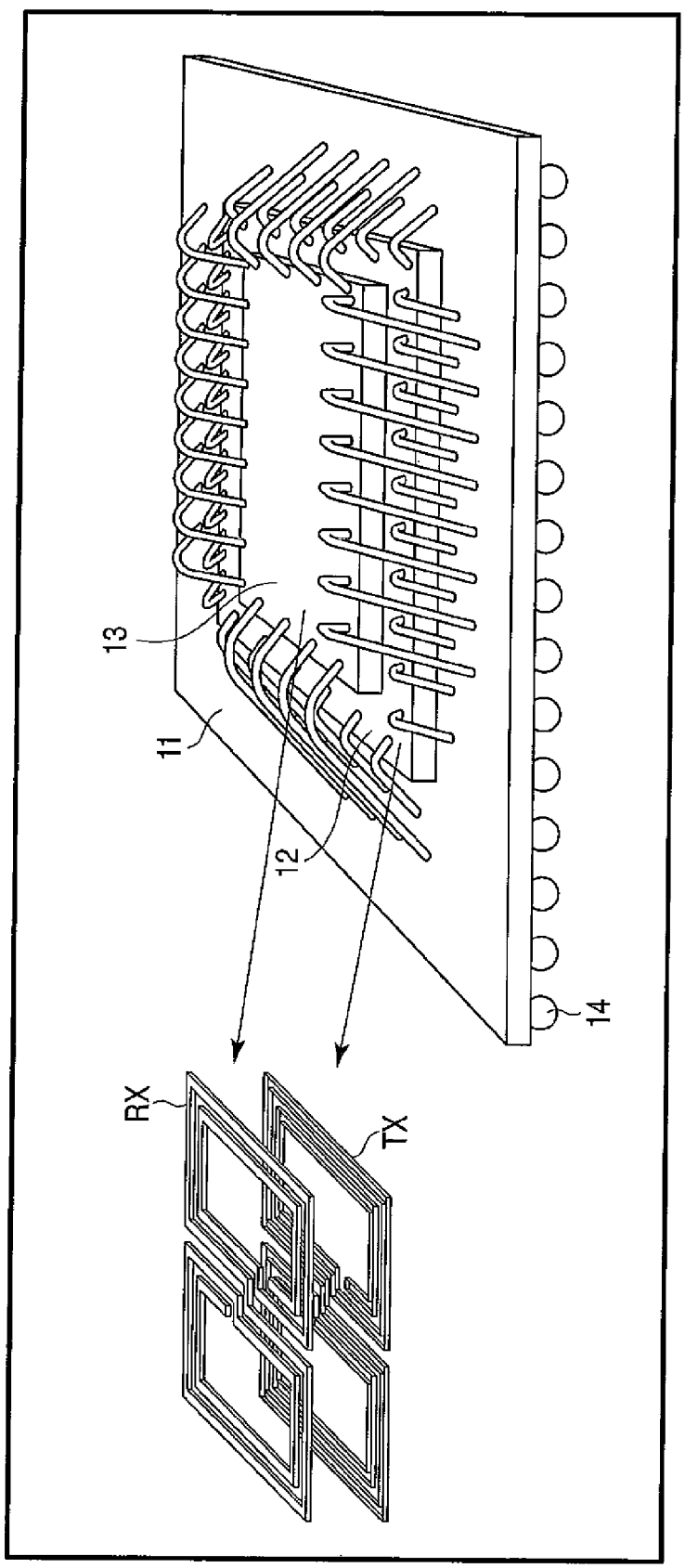
FIG. 1 shows ICL.

A stacked-chip device of an aspect of the present invention will be described below in detail with reference to the accompanying drawings.

1. Outline

In putting ICL into practice, for the purpose of cost reduction, it is necessary that configurations of a general-purpose control chip (general-purpose logic chip) and a general-purpose memory chip not be greatly changed. Therefore, effectively transmitting/receiving inductors mounted on the chips are provided identically.

However, ICL is based on the CoC technique in which the chips are stacked and accommodated in a single package. Therefore, when the transmitting/receiving inductors of the chips are identically provided, the transmitting inductors are overlapped and the receiving inductors are overlapped, which disables the signal transmission between the chips.

In an embodiment of the invention, the transmitting/receiving inductors in one chip are provided in line symmetry to an axis of symmetry.

In the line-symmetric configuration, in cases where a second inductive chip is stacked on a first inductive chip, the axes of symmetry of the first and second inductive chips match up with each other, and the second inductive chip is disposed back to front with respect to the first inductive chip, or the second inductive chip is disposed upside down with respect to the first inductive chip. As a result, the transmitting inductor and the receiving inductor face each other to realize ICL.

"The inductive chip is disposed back to front" means that one of two inductive chips orientated toward the same direction is rotated by 180° in a direction in which the inductive chips are stacked (hereinafter referred to as the perpendicular direction) about an axis (axis parallel to a chip surface) perpendicular to the axis of symmetry and reversed to cause the surfaces or rear sides of the inductive chips to face each other. "The inductive chip is disposed upside down" means that one of two inductive chips orientated toward the same direction is rotated by 180° in parallel with the chip surface about the axis perpendicular to the axis of symmetry (perpendicular to the chip surface).

In cases where a third inductive chip is further stacked on the first and second inductive chips, the axes of symmetry of the first to third inductive chips match up with one another, and the third inductive chip is rotated like the second inductive chip, thereby realizing a through system in which the signal is transmitted in a burst from the first inductive chip to the second or third inductive chip while the signal is transmitted in a burst from the second or third inductive chip to the first inductive chip.

The through system is effectively used when the radio signal intensity can be increased, that is, when the signal is transmitted over a long distance via radio.

On the other hand, when the first and third inductive chips are orientated toward the same direction without rotating the third inductive chip, thereby realizing a bucket-brigade system in which the signal is transmitted from the second inductive chip to the third inductive chip after the signal is transmitted from the first inductive chip to the second inductive chip while the signal is transmitted from the second inductive chip to the first inductive chip after the signal is transmitted from the third inductive chip to the second inductive chip.

The bucket-brigade system is effectively used when the radio signal intensity cannot be increased, that is, when the signal is transmitted over a short distance via radio.

Thus, the radio signal intensity (signal transmission distance), signal transmission path, and layout of the transmitting/receiving inductors, which become troublesome in applying ICL to an actual product, are solved in an embodiment of the invention, so that the practical use of ICL can be realized.

2. Inductive Chip Link

ICL, as premised in the invention, will be described.

FIG. 1 shows of ICL.

For example, a package board 11 is a ball grid array (BGA) package. Two chips 12 and 13 having different functions are mounted on a first surface of the package board 11. Bumps 14 are disposed on a second surface of the package board 11.

The two chips 12 and 13 are stacked, and the signal is transmitted between the two chips 12 and 13 via radio. For example, a transmitting inductor TX as a transmission antenna is disposed in the chip 12, and a receiving inductor RX as a receiving antenna is disposed in the chip 13.

When a temporally-varying current is passed through the transmitting inductor TX, a current is also passed through the receiving inductor RX by the electromagnetic induction. Therefore, the signal is transmitted from the transmitting inductor TX to the receiving inductor RX.

Preferably a power supply voltage is applied to the chips 12 and 13 through the bump or bonding wire.

ICL has the following advantages compared with the case in which the signal is transmitted through the bump or bonding wire.

Because assembly is simplified, the production cost is reduced. Area penalty is reduced when the transmitting inductor TX and the receiving inductor RX are formed on an insulating layer on a semiconductor substrate. An electrostatic discharge (ESD) protection circuit is eliminated. Further, low-power drive and high-speed drive can be performed.

3. Embodiments (1) First Embodiment

FIG. 2 shows ICL according to a first embodiment of the invention.

It is assumed that at least three chips are stacked. In the first embodiment, five chips are stacked.

The lowermost chip is an inductive chip L1 having a first function. For example, inductive chip L1 is a control chip (logic chip). The four chips stacked on inductive chip L1 are inductive chips M1 to M4 having a second function that is different from the first function. Inductive chips M1 to M4 are a memory chip including a volatile memory such as DRAM or a nonvolatile memory such as a flash memory.

Spacers (for example, an insulating material) S are disposed between the five inductive chips L1 and M1 to M4.

In the first embodiment, the through system is used as the signal transmission path. In the through system, the signal is transmitted in a burst from inductive chip L1 to inductive chips M1 to M4, and the signal is transmitted in a burst from inductive chips M1 to M4 to inductive chip L1.

In this case, the transmitting inductor TX of inductive chip L1 and the receiving inductors RX of inductive chips M1 to M4 are disposed in a straight line in a direction in which inductive chips L1 and M1 to M4 are stacked (hereinafter referred to as the perpendicular direction). The receiving inductor RX of inductive chip L1 and the transmitting inductors TX of inductive chips M1 to M4 are disposed in a straight line in the perpendicular direction.

However, the layouts of the transmitting inductors TX and receiving inductors RX, which are disposed in the five inductive chips L1 and M1 to M4, are identical.

The meaning will be described below.

Figure 3:
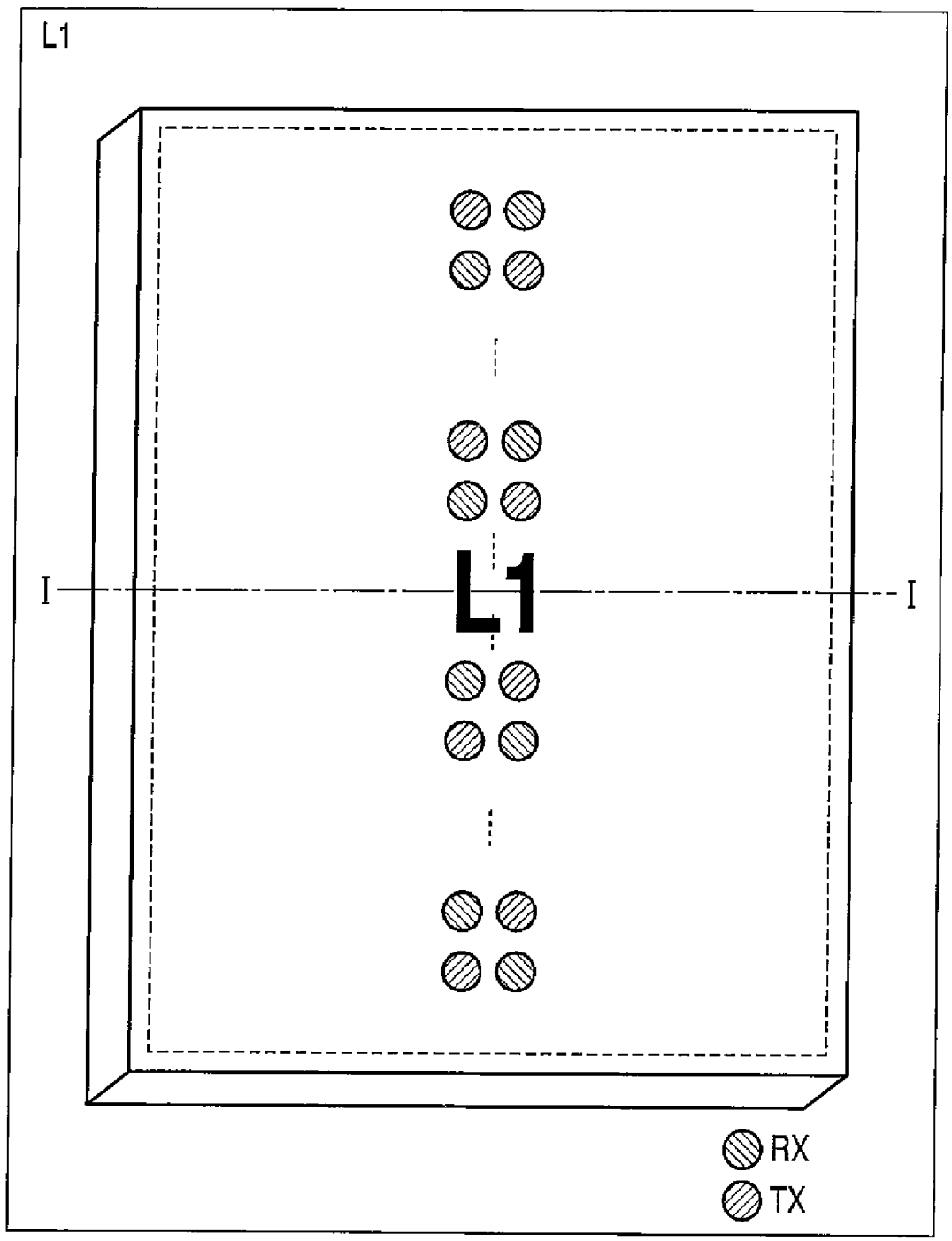
FIGS. 3 and 4 show inductive chips of a first embodiment.

FIG. 3 shows an example of the layout of the transmitting/receiving inductors in inductive chip L1 of FIG. 2.

The transmitting inductors TX and the receiving inductors RX are provided in line symmetry to an axis of symmetry (for example, a center line) I of inductive chip L1.

In the first embodiment, the transmitting inductors TX and the receiving inductors RX are disposed in the center of inductive chip L1. However, the disposition of the transmitting inductors TX and receiving inductors RX is not limited to the first embodiment. The axis of symmetry I may be located at any position on the chip as long as the transmitting inductors TX and the receiving inductors RX are provided in line symmetry to the axis of symmetry I of inductive chip L1.

Figure 4:
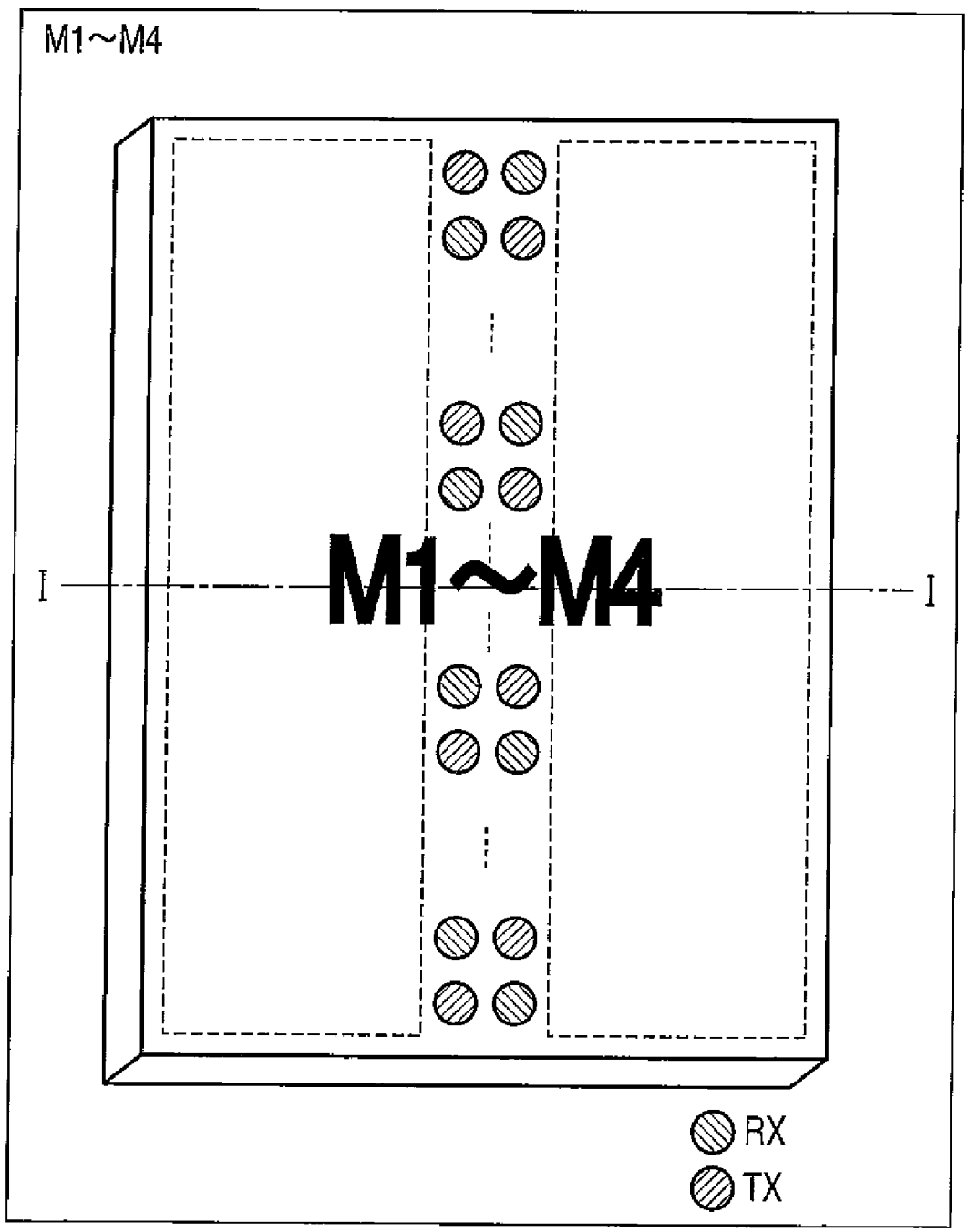

FIG. 4 shows an example of the layout of the transmitting/receiving inductors in inductive chips M1 to M4 of FIG. 2.

The transmitting inductors TX and the receiving inductors RX are provided in line symmetry to the axes of symmetry (for example, the center lines) I of inductive chips M1 to M4.

In the first embodiment, the transmitting inductors TX and the receiving inductors RX are disposed in the centers of inductive chips M1 to M4. However, the disposition of the transmitting inductors TX and receiving inductors RX is not limited to the first embodiment. The axis of symmetry I may be located at any position on the chip as long as the transmitting inductors TX and the receiving inductors RX are provided in line symmetry to the axes of symmetry I of inductive chips M1 to M4.

The layout of the transmitting inductors TX and receiving inductors RX in inductive chip L1 of FIG. 3 is completely identical to the layouts of the transmitting inductors TX and receiving inductors RX in inductive chips M1 to M4 of FIG. 4.

The layouts of the transmitting inductors TX and receiving inductors RX in inductive chips L1 and M1 to M4 are identical to each other, so that a general-purpose chip can be applied to reduce the production cost.

However, ICL is not established without further steps.

Figure 5:
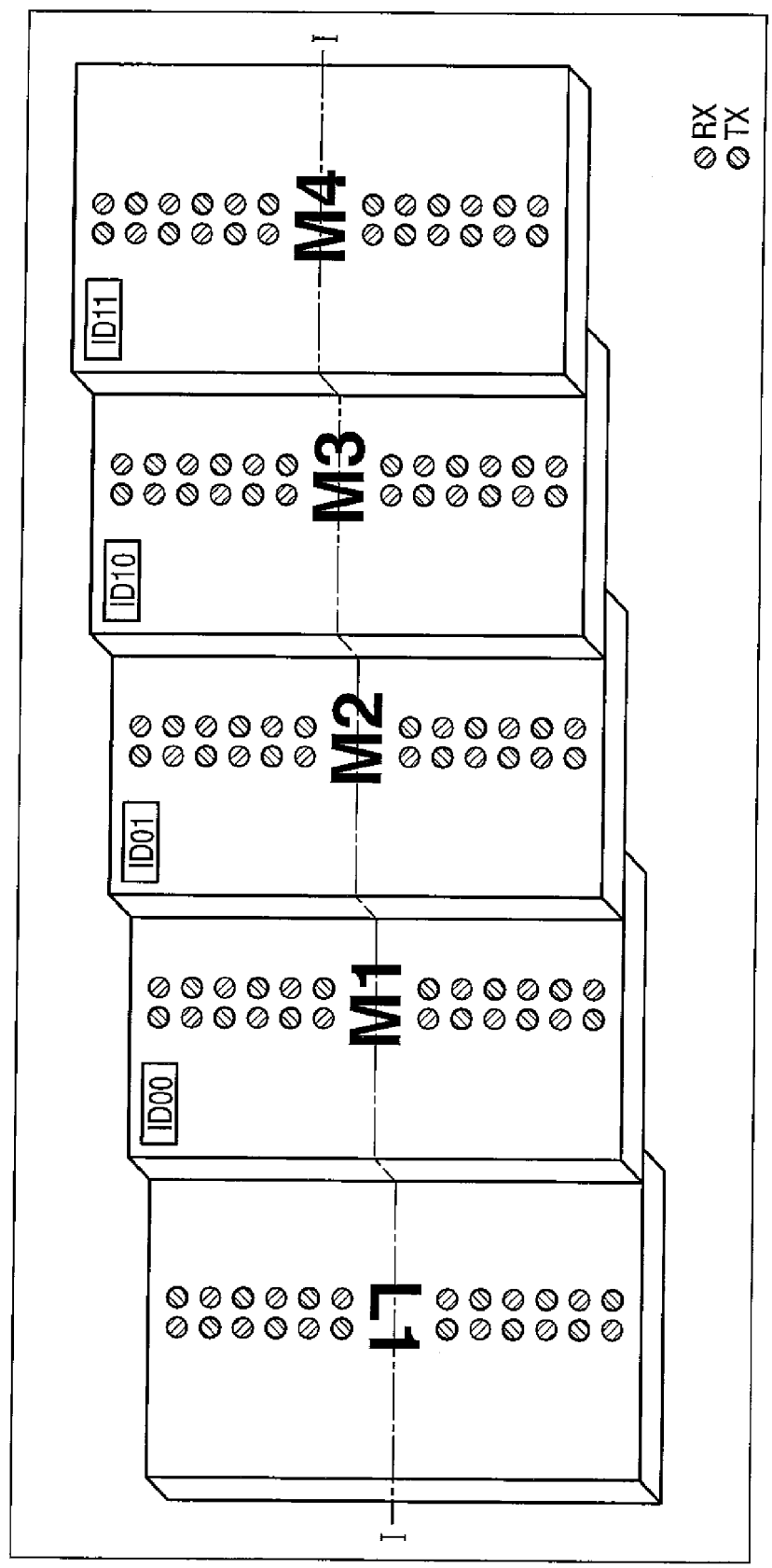
FIG. 5 shows ICL of a first embodiment.

For example, as shown in FIG. 5, during the assembly, the five inductive chips L1 and M1 to M4 are stacked while the axes of symmetry I thereof match up.

Inductive chips M1 to M4 are disposed back to front or upside down with respect to inductive chip L1.

The numbers ID00, ID01, ID10, and ID11 designate a chip ID.

In an example of FIG. 5, inductive chips M1 to M4 are disposed upside down with respect to inductive chip L1.

The disposition of FIG. 5 is based on inductive chip L1. Obviously inductive chip L1 may be disposed back to front or upside down with respect to inductive chips M1 to M4.

The above-described operation can realize the structure in which the transmitting inductors TX of inductive chip L1 and the receiving inductors RX of inductive chips M1 to M4 are disposed in a straight line in the perpendicular direction while the receiving inductors RX of inductive chip L1 and the transmitting inductors TX of inductive chips M1 to M4 are disposed in a straight line in the perpendicular direction.

A determination whether inductive chips M1 to M4 actually receive data can be made by the chip ID.

In the first embodiment, the axes of symmetry of inductive chips L1 and M1 to M4 are set to the center line of the chip, and center points of inductive chips L1 and M1 to M4 match up with one another. Therefore, the assembly is simplified more preferably.

Preferably the number of inductive chips M1 to M4 mounted on inductive chip L1 is $2^n$ (n being a natural number).

As described above, ICL in which at least three chips are stacked can be realized in the first embodiment.

(2) Second Embodiment

Figure 6:
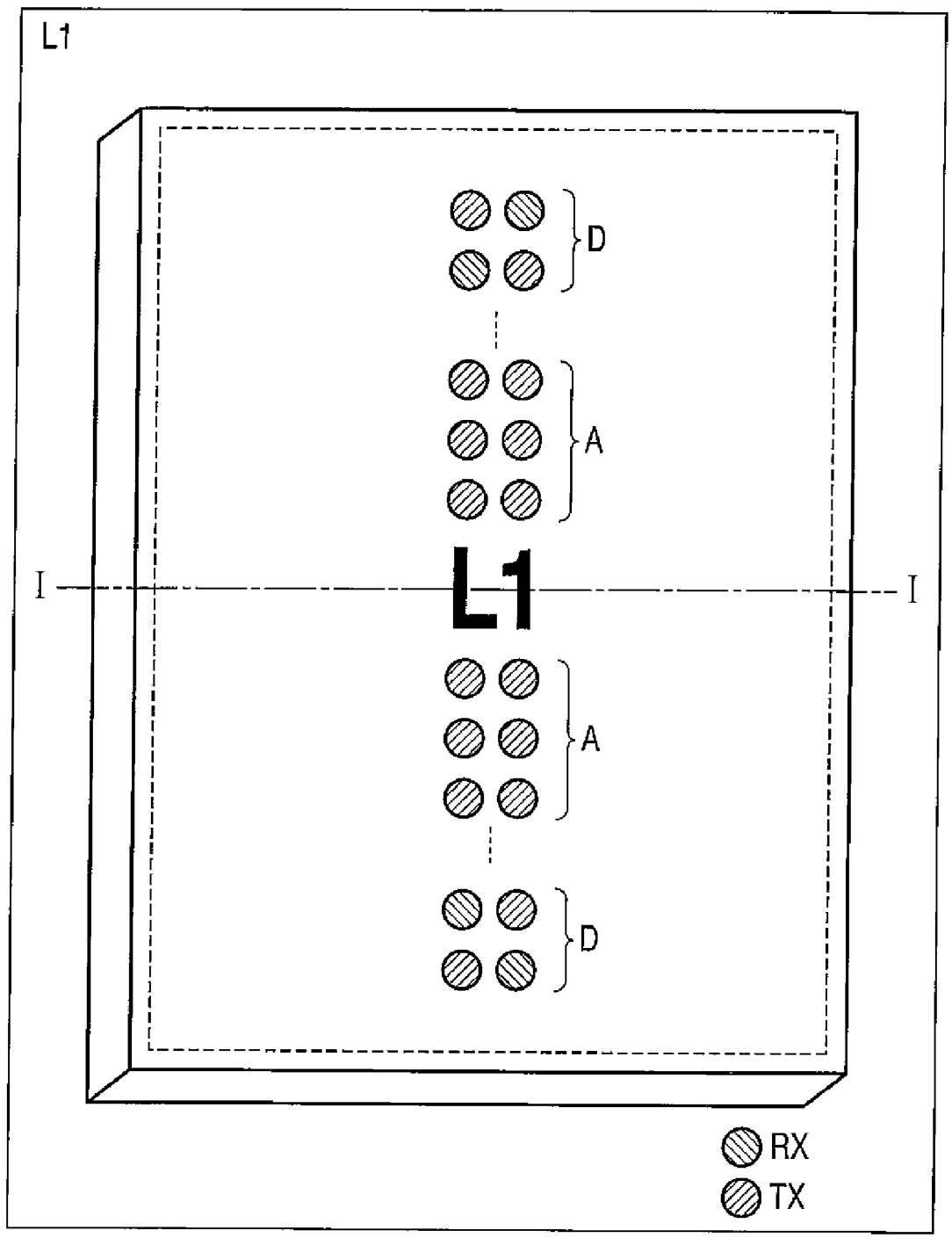
FIGS. 6 and 7 show inductive chips of a second embodiment.
Figure 7:
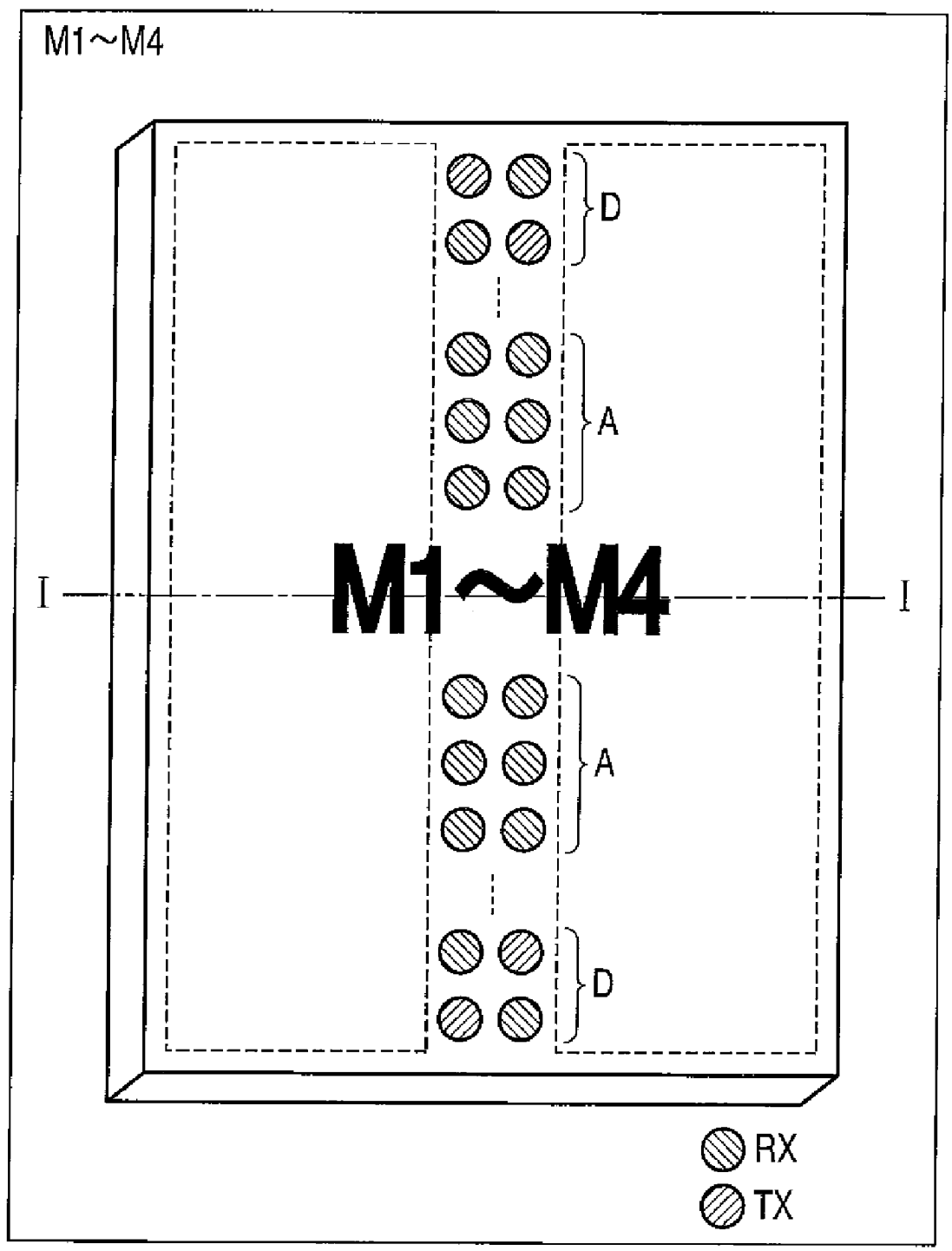

FIGS. 6 to 8 show ICL according to a second embodiment of the invention.

The second embodiment is a modification of the first embodiment.

In the second embodiment, it is assumed that inductive chip L1 is the control chip (logic chip) while inductive chips M1 to M4 are the memory chips.

A control signal, an address signal, and data are transmitted from inductive chip L1 that is the control chip to inductive chips M1 to M4 that are the memory chips. The control signal and the address signal are unidirectionally transmitted from inductive chip L1 to inductive chips M1 to M4, and the data is bidirectionally transmitted between inductive chip L1 and inductive chips M1 to M4.

Therefore, as shown in FIG. 6, because the transmitting inductors (region A) TX are provided in inductive chip L1 in order to transmit the control signal and the address signal, the number of transmitting inductors is larger than the number of receiving inductors.

On the other hand, as shown in FIG. 7, because the receiving inductors (region A) RX are provided in inductive chips M1 to M4 in order to receive the control signal and the address signal, the number of receiving inductors is larger than the number of transmitting inductors.

Because the data is bidirectionally transmitted between inductive chip L1 and inductive chips M1 to M4, the number of transmitting/receiving inductors (region D) TX and RX in inductive chip L1 is equal to the number of transmitting/receiving inductors (region D) TX and RX in inductive chips M1 to M4.

FIG. 8 shows a positional relationship between the five inductive chips L1 and M1 to M4.

Because other configurations are identical to those of the first embodiment, the detailed description thereof is omitted.

ICL in which at least three chips are stacked can also be realized in the second embodiment.

(3) Third Embodiment

Figure 9:
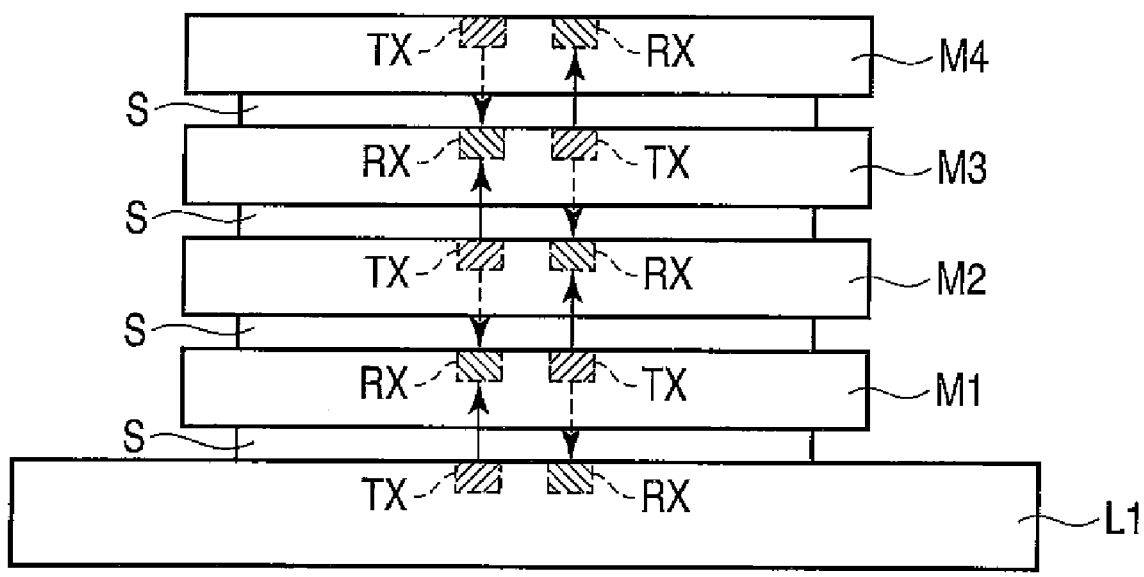
FIG. 9 shows ICL of a third embodiment.

FIG. 9 shows ICL according to a third embodiment of the invention.

It is assumed that at least three chips are stacked. In the third embodiment, five chips are stacked.

The lowermost chip is inductive chip L1 having the first function. For example, inductive chip L1 is the control chip (logic chip). The four chips stacked on inductive chip L1 are inductive chips M1 to M4 having the second function that is different from the first function. Inductive chips M1 to M4 are the memory chip including a volatile memory such as DRAM or a nonvolatile memory such as a flash memory.

The spacers (for example, an insulating material) S are disposed between the five inductive chips L1 and M1 to M4.

In the third embodiment, the bucket-brigade system is used as the signal transmission path. In the bucket-brigade system, the signal is transmitted from inductive chip L1 to inductive chip M1, the signal is transmitted from inductive chip M1 to inductive chip M2, and the signal is transmitted from inductive chip M2 to inductive chip M3.

In this case, the inductors that are disposed in a straight line in the direction in which inductive chips L1 and M1 to M4 are stacked (hereinafter referred to as the perpendicular direction) have a layout in which the transmitting inductors TX and the receiving inductors RX are alternately disposed.

For example, the receiving inductor RX of inductive chip M1 is disposed on the transmitting inductor TX of inductive chip L1, the transmitting inductor TX of inductive chip M2 is disposed on the receiving inductor RX of inductive chip M1, the receiving inductor RX of inductive chip M3 is disposed on the transmitting inductor TX of inductive chip M2, and the transmitting inductor TX of inductive chip M4 is disposed on the receiving inductor RX of inductive chip M3.

However, the layouts of the transmitting inductors TX and receiving inductors RX, which are disposed in inductive chips L1 and M1 to M4, are identical.

The meaning will be described below.

Figure 10:
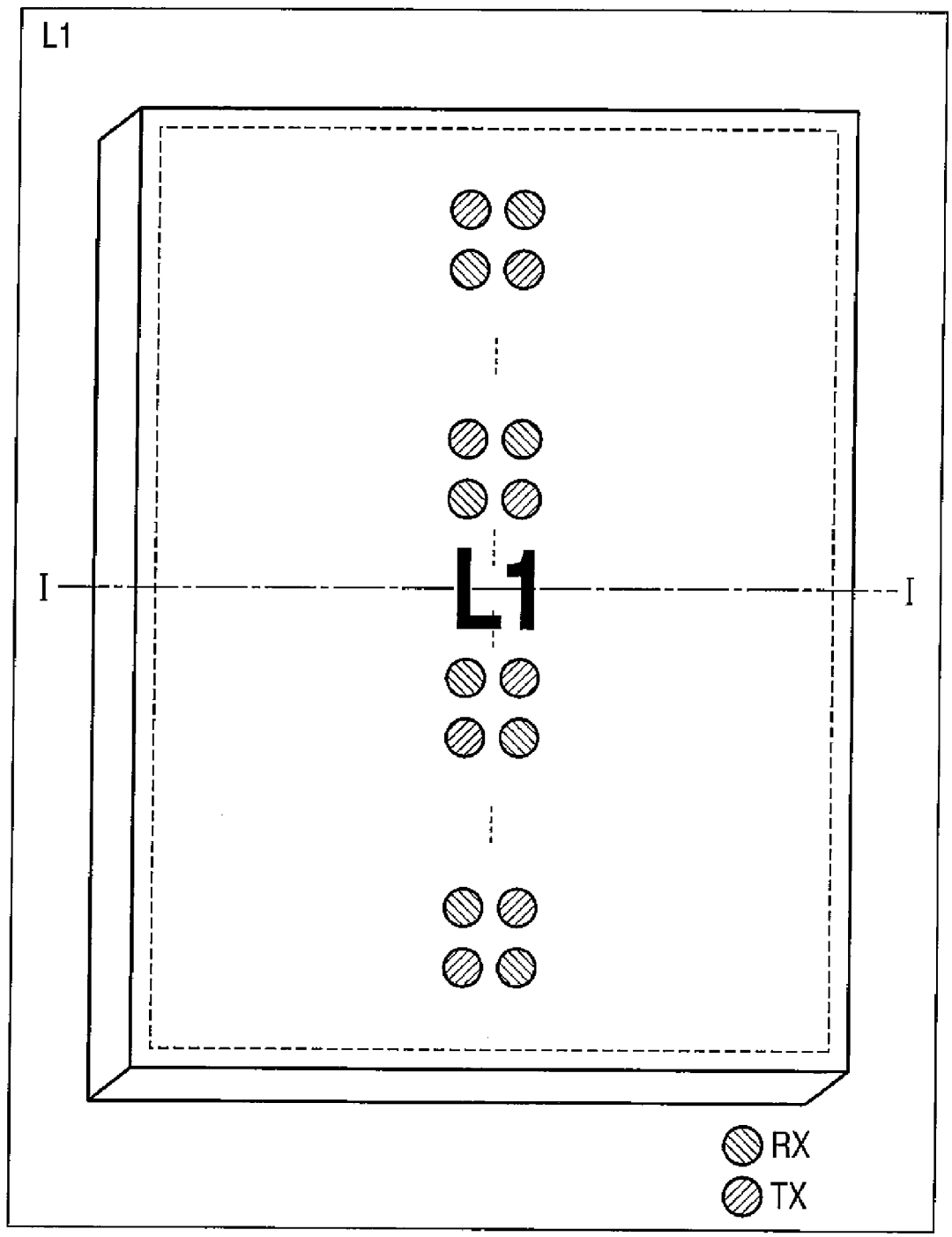
FIGS. 10 and 11 show inductive chips of a third embodiment.

FIG. 10 shows an example of the layout of the transmitting/receiving inductors in inductive chip L1 of FIG. 9.

The transmitting inductors TX and the receiving inductors RX are provided in line symmetry to the axis of symmetry (for example, the center line) I of inductive chip L1.

In the third embodiment, the transmitting inductors TX and the receiving inductors RX are disposed in the center of inductive chip L1. However, the disposition of the transmitting inductors TX and receiving inductors RX is not limited to the third embodiment. The axis of symmetry I may be located at any position on the chip as long as the transmitting inductors TX and the receiving inductors RX are provided in line symmetry to the axis of symmetry I of inductive chip L1.

Figure 11:
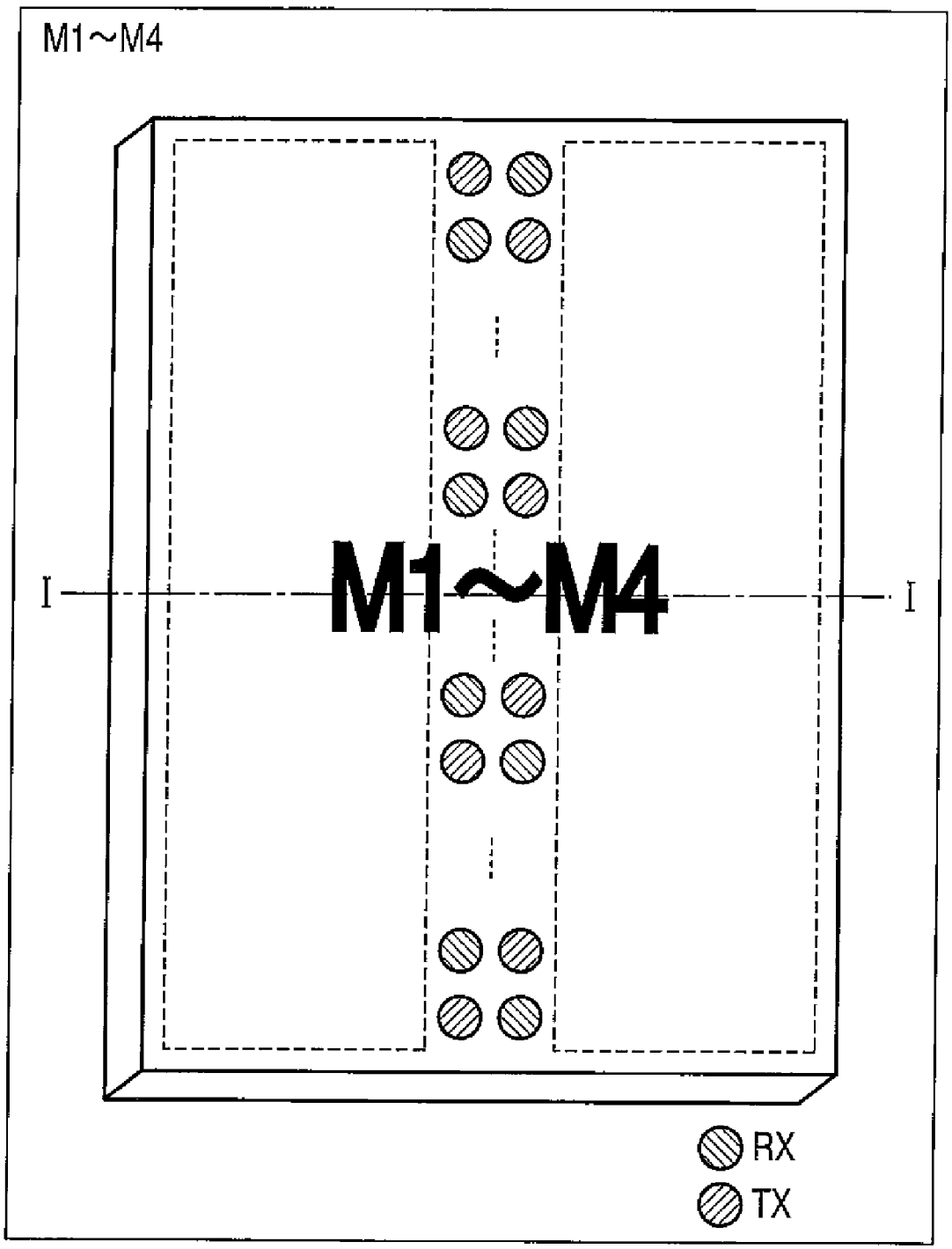

FIG. 11 shows an example of the layout of the transmitting/receiving inductors in inductive chips M1 to M4 of FIG. 9.

The transmitting inductors TX and the receiving inductors RX are provided in line symmetry to the axes of symmetry (for example, the center lines) I of inductive chips M1 to M4.

In the third embodiment, the transmitting inductors TX and the receiving inductors RX are disposed in the centers of inductive chips M1 to M4. However, the disposition of the transmitting inductors TX and receiving inductors RX is not limited to the third embodiment. The axis of symmetry I may be located at any position on the chip as long as the transmitting inductors TX and the receiving inductors RX are provided in line symmetry to the axes of symmetry I of inductive chips M1 to M4.

The layout of the transmitting inductors TX and receiving inductors RX in inductive chip L1 of FIG. 10 is completely identical to the layouts of the transmitting inductors TX and receiving inductors RX in inductive chips M1 to M4 of FIG. 11.

The layouts of the transmitting inductors TX and receiving inductors RX in inductive chips L1 and M1 to M4 are identical to each other, so that a general-purpose chip can be applied to reduce the production cost.

However, ICL is not established without further steps.

Figure 12:
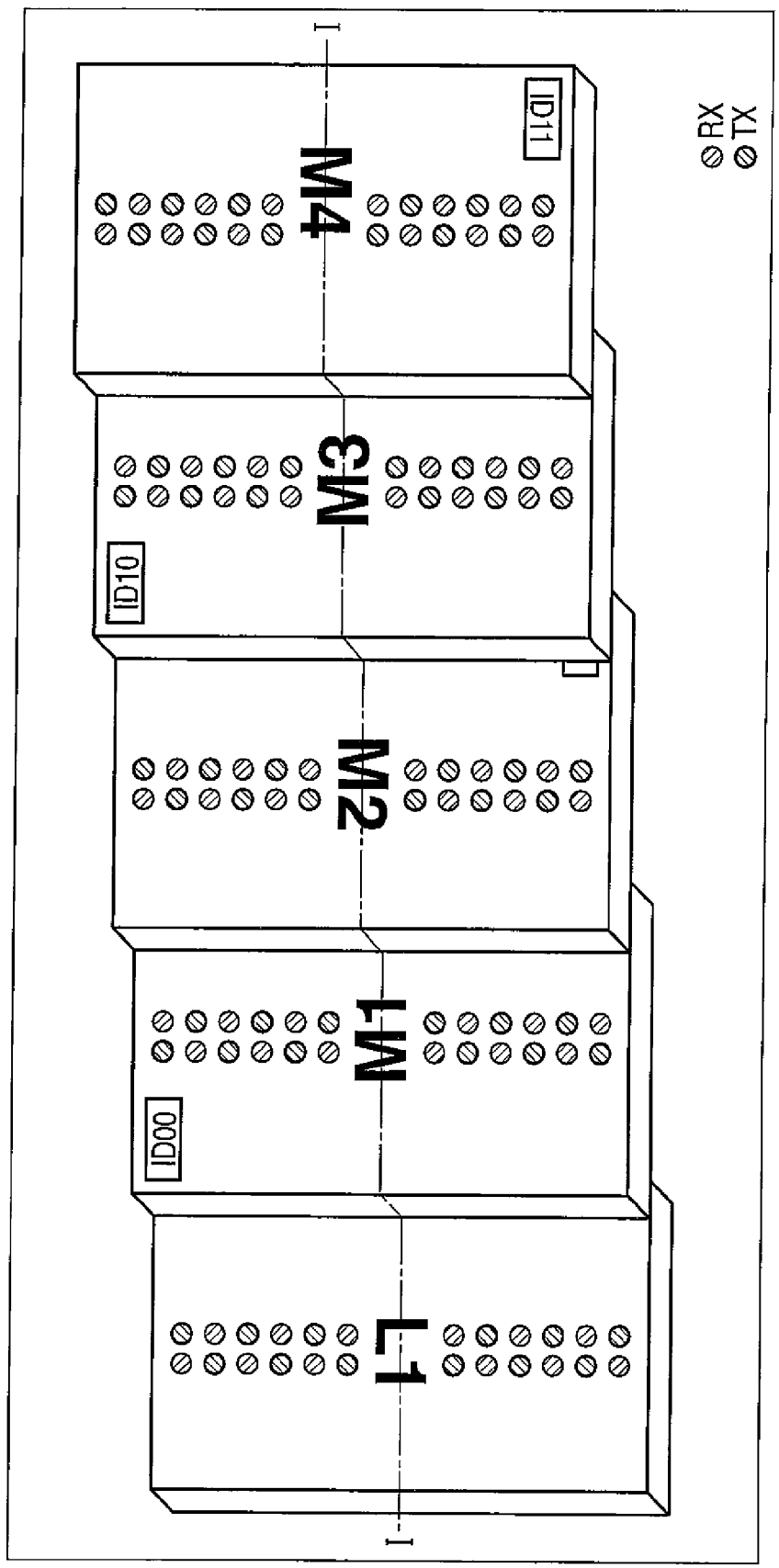
FIG. 12 shows ICL of a third embodiment.

For example, as shown in FIG. 12, during the assembly, the five inductive chips L1 and M1 to M4 are stacked while the axes of symmetry I thereof match up.

Inductive chips M1 and M3 are disposed back to front or upside down with respect to inductive chips L1, M2, and M4.

The numbers ID00, ID01, ID10, and ID11 designate a chip ID.

In an example of FIG. 12, inductive chips M1 and M3 are disposed upside down with respect to inductive chips L1, M2, and M4.

The disposition of FIG. 12 is based on inductive chips L1, M2, and M4. Obviously inductive chips L1, M2, and M4 may be disposed back to front or upside down with respect to inductive chips M1 and M3.

The above-described operation can realize the structure in which the transmitting inductors TX and the receiving inductors RX are alternately disposed for the inductors disposed in a straight line in the perpendicular direction of inductive chips L1 and M1 to M4.

A determination whether inductive chips M1 to M4 actually receive data can be made by the chip ID.

In the third embodiment, the axes of symmetry of inductive chips L1 and M1 to M4 are set to the center line of the chip, and center points of inductive chips L1 and M1 to M4 match up with one another. Therefore, the assembly is simplified more preferably.

Preferably the number of inductive chips M1 to M4 mounted on inductive chip L1 is $2^n$ (n being a natural number).

As described above, ICL in which at least three chips are stacked can be realized in the third embodiment.

(4) Fourth Embodiment

Figure 15:
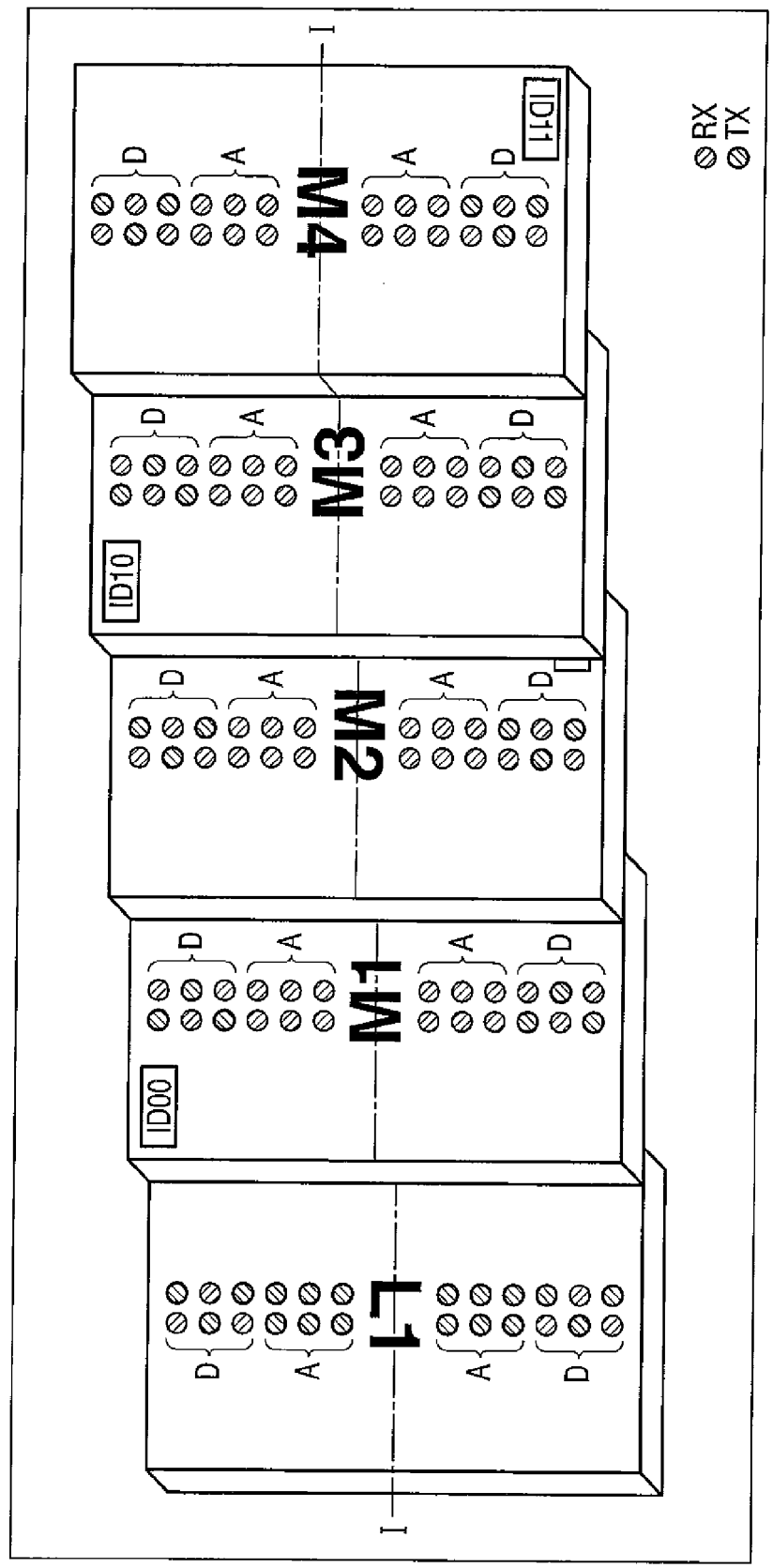
FIG. 15 shows ICL of a fourth embodiment.

FIGS. 13 to 15 show ICL according to a fourth embodiment of the invention.

The fourth embodiment is a modification of the third embodiment.

In the fourth embodiment, it is assumed that inductive chip L1 is the control chip (logic chip) while inductive chips M1 to M4 are the memory chips.

The control signal, the address signal, and the data are transmitted from inductive chip L1 that is the control chip to inductive chips M1 to M4 that are the memory chips. The control signal and the address signal are unidirectionally transmitted from inductive chip L1 to inductive chips M1 to M4, and the data is bidirectionally transmitted between inductive chip L1 and inductive chips M1 to M4.

Therefore, as shown in FIG. 13, because the transmitting inductors (region A) TX are provided in inductive chip L1 in order to transmit the control signal and the address signal, the number of transmitting inductors is larger than the number of receiving inductors.

On the other hand, as shown in FIG. 14, because the receiving inductors (region A) RX are provided in inductive chips M1 to M4 in order to receive the control signal and the address signal, the number of receiving inductors is larger than the number of transmitting inductors.

Because the data is bidirectionally transmitted between inductive chip L1 and inductive chips M1 to M4, the number of transmitting/receiving inductors (region D) TX and RX in inductive chip L1 is equal to the number of transmitting/receiving inductors (region D) TX and RX in inductive chips M1 to M4.

FIG. 15 shows a positional relationship between the five inductive chips L1 and M1 to M4.

Because other configurations are identical to those of the first embodiment, the detailed description thereof is omitted.

ICL in which at least three chips are stacked can also be realized in the fourth embodiment.

(5) Fifth Embodiment

A fifth embodiment relates to a position of the axis of symmetry of the transmitting/receiving inductors in the first to fourth embodiments.

Figure 16:
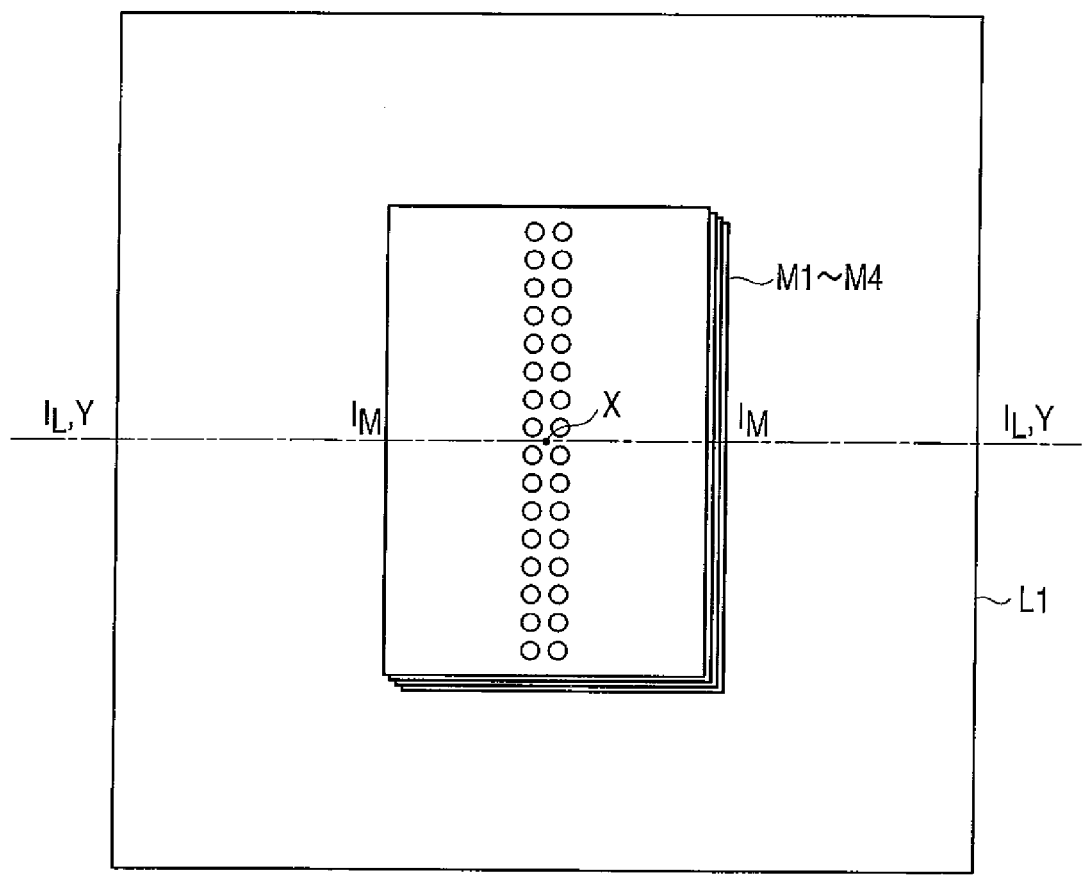
FIGS. 16 to 18 show ICL of a fifth embodiment.

In an example of FIG. 16, an axis of symmetry $I_L$ of transmitting/receiving inductors (indicated by "o") mounted on inductive chip L1 is matched with a center line Y of inductive chip L1, and axes of symmetry $I_M$ of transmitting/receiving inductors (indicated by "O") mounted on inductive chips M1 to M4 match up with center lines Y of inductive chips M1 to M4.

In the example of FIG. 16, the center points X of all inductive chips L1 and M1 to M4 match up with one another, and the center lines Y of all inductive chips L1 and M1 to M4 match up with one another.

Figure 17:
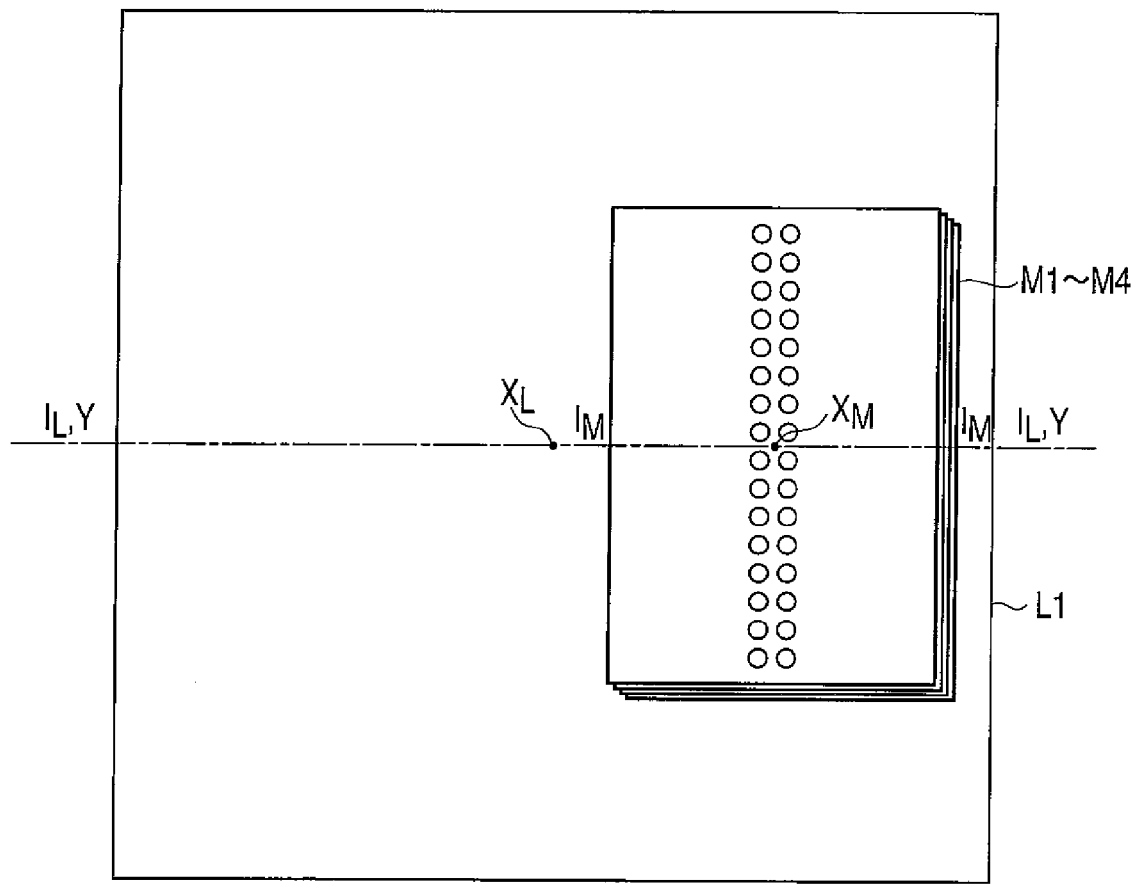

In an example of FIG. 17, the axis of symmetry $I_L$ of transmitting/receiving inductors (indicated by "o") mounted on inductive chip L1 is matched with the center line Y of inductive chip L1, and the axes of symmetry $I_M$ of transmitting/receiving inductors (indicated by "o") mounted on inductive chips M1 to M4 match up with the center lines Y of inductive chips M1 to M4.

In the example of FIG. 17, center points $X_M$ of inductive chips M1 to M4 match up with one another, and a center point $X_L$ of inductive chip L1 deviates from the center points $X_M$ of inductive chips M1 to M4. The center lines Y of all inductive chips L1 and M1 to M4 match up with one another.

Figure 18:
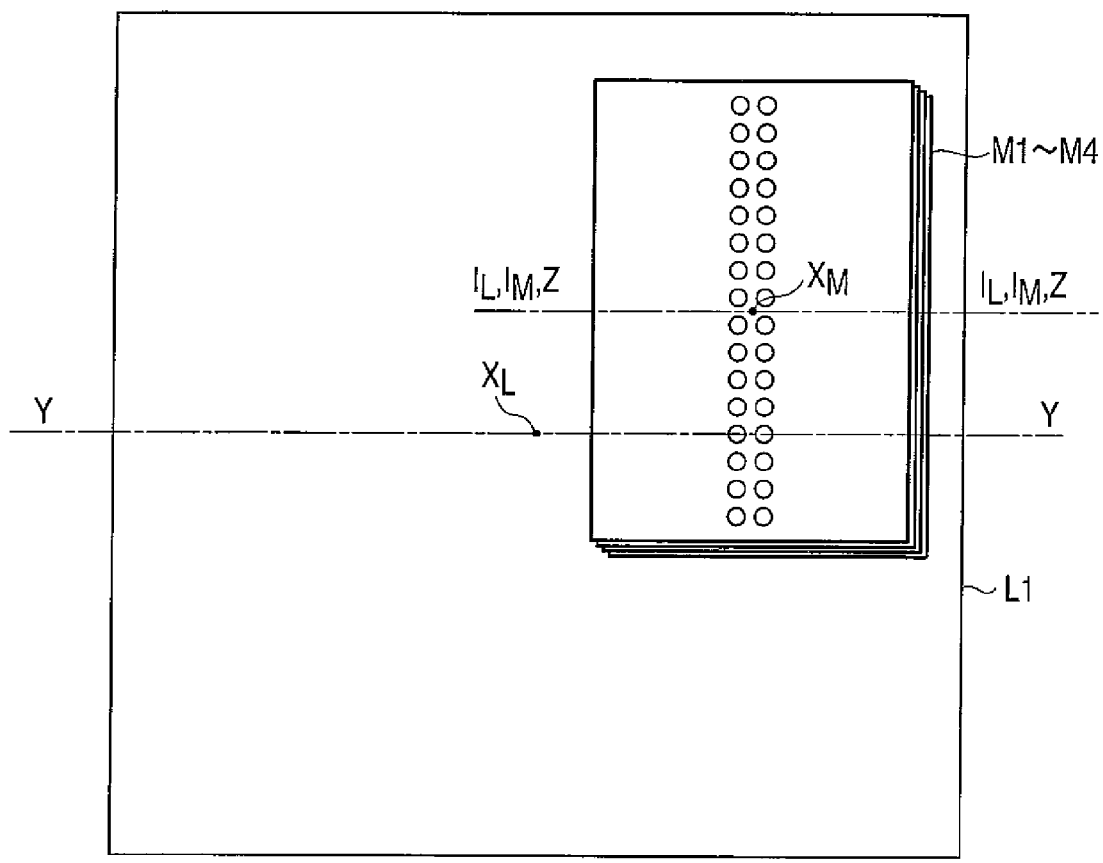

In an example of FIG. 18, the axis of symmetry $I_L$ of transmitting/receiving inductors (indicated by "o") mounted on inductive chip L1 deviates from the center line Y of inductive chip L1, and the axes of symmetry $I_M$ of transmitting/receiving inductors (indicated by "o") mounted on inductive chips M1 to M4 match up with center lines Z of inductive chips M1 to M4.

In the example of FIG. 18, the center points $X_M$ of inductive chips M1 to M4 match up with one another, and the center point $X_L$ of inductive chip L1 deviates from the center points $X_M$ of inductive chips M1 to M4. The center line Y of inductive chip L1 deviates from the center lines Z of inductive chips M1 to M4.

In the three examples of FIGS. 16 to 18, the layouts of the transmitting/receiving inductors of all inductive chips L1 and M1 to M4 are identical to one another, and some of inductive chips L1 and M1 to M4 are rotated like the first to fourth embodiments, thereby realizing ICL.

(6) Sixth Embodiment

A sixth embodiment proposes a technique of transmitting and receiving a chip enable signal in ICL of the first to fourth embodiments.

Figure 19:
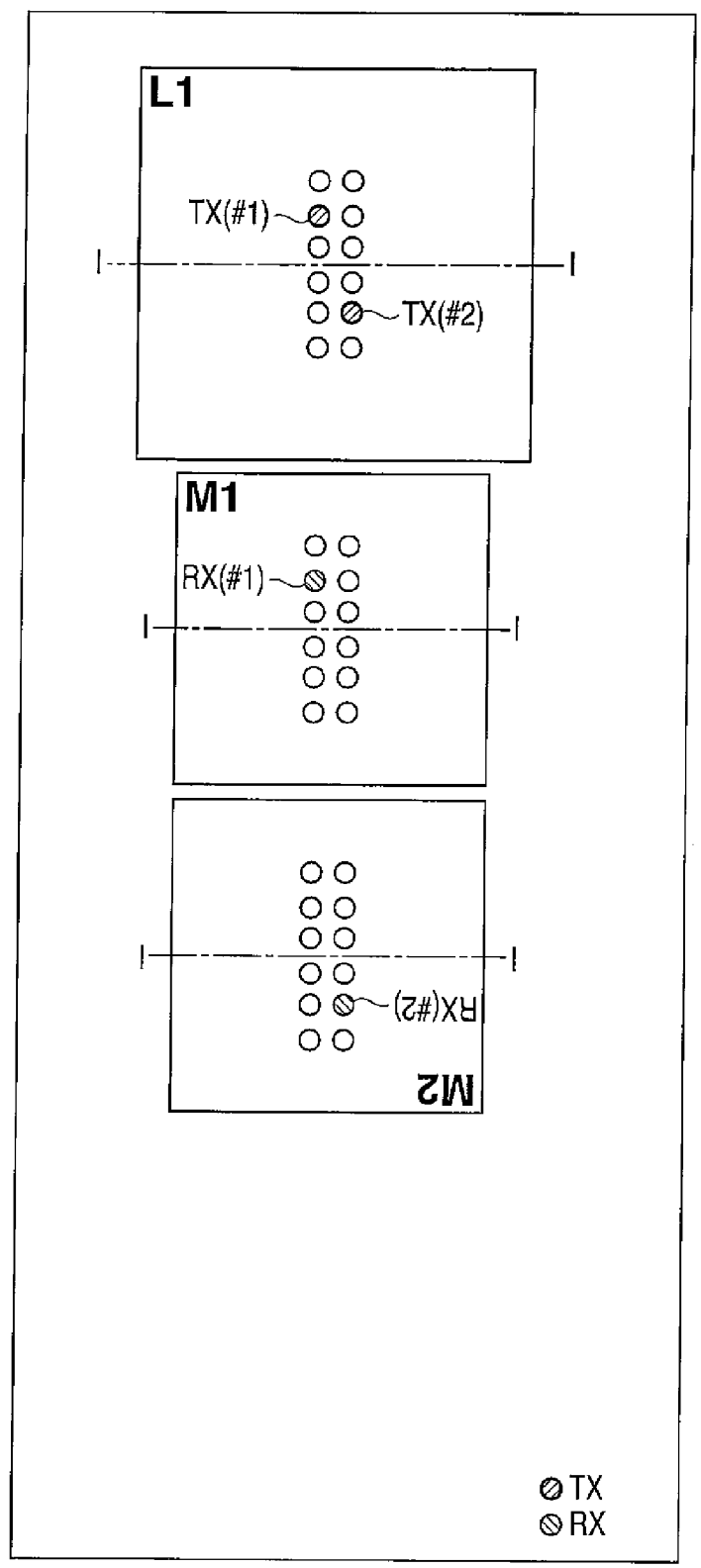
FIG. 19 shows ICL of a sixth embodiment.

FIG. 19 shows ICL according to the sixth embodiment of the invention.

The case in which the chip enable signal is transmitted from inductive chip L1 to inductive chips M1 and M2 to activate one of inductive chips M1 and M2 will be discussed.

It is assumed that inductive chip M1 is orientated toward the same direction as inductive chip L1 while inductive chip M2 is orientated upside down with respect to inductive chip L1.

In the transmitting inductors TX provided in inductive chip L1, a first transmitting inductor TX(#1) and a second transmitting inductor TX(#2), which are disposed in point symmetry, are used to transmit the chip enable signal.

For inductive chips M1 and M2, receiving inductors RX(#1) and RX(#2) are provided at the same positions as the transmitting inductors TX(#1) and TX(#2) in order to receive the chip enable signal. However, inductive chips M1 and M2 are disposed upside down with respect to each other.

Accordingly, in inductive chip M1, a first chip enable signal transmitted from the first transmitting inductor TX(#1) can be received by the receiving inductor RX(#1) used to receive the first chip enable signal.

In inductive chip M2, a second chip enable signal transmitted from the second transmitting inductor TX(#2) can be received by the receiving inductor RX(#2) used to receive the second chip enable signal.

As described above, inductive chips M1 and M2 can be selected by the chip enable signal without changing the layouts of the transmitting/receiving inductors in inductive chips M1 and M2.

(7) Others

The common feature of the first to sixth embodiments is that the inductive chip is rotated while disposed back to front or upside down. At this point, an address map is changed in each inductive chip. The address map is changed based on the chip ID and the transmission and reception of the control signal with the transmitting/receiving inductors of the invention.

4. Application Example

The invention is effectively applied to ICL including at least three chips.

For example, a graphic chip, a DRAM chip, and a VRM chip may be laminated by ICL. A mobile chip, a DRAM chip, and a VRM chip may be laminated by ICL.

The reduction of the package size, the low power consumption, and high performance can be realized by ICL compared with a multi-chip module (MCM).

5. Conclusion

The invention can achieve the versatility of ICL and the decrease in production cost.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A stacked-chip device comprising:
a first inductive chip having a first function;
a second inductive chip having a second function different from the first function, which is stacked on the first inductive chip; and
a third inductive chip having the second function, which is stacked on the second inductive chip,
wherein each of the first, second and third inductive chips has an array of transmitting inductors which transmit data and receiving inductors which receive data,
wherein an order of arranging the transmitting inductors and the receiving inductors is the same in the first, second and third inductive chips,
wherein the transmitting inductors and the receiving inductors in the first inductive chip are arranged symmetrically with respect to a first line, the transmitting inductors and the receiving inductors in the second inductive chip are arranged symmetrically with respect to a second line which passes through a center of the second inductive chip, and the transmitting inductors and the receiving inductors in the third inductive chip are arranged symmetrically with respect to a third line which passes through a center of the third inductive chip,
wherein the first, second and third lines are overlapped,
wherein the second inductive chip is disposed in upside-down or back to front to the first and third inductive chips.

2. The device according to claim 1,
wherein the first inductive chip is a control chip which controls the second and third inductive chips, and each of the second and third inductive chips is a memory chip.

3. The device according to claim 2,
wherein the number of the transmitting inductors is larger than that of the receiving inductors in the first inductive chip.

4. The device according to claim 2,
wherein the number of the receiving inductors is larger than that of the transmitting inductors in each of the second and third inductive chips.

5. The device according to claim 1,
wherein data is transferred by a bucket-brigade system in which data is transferred from the second inductive chip to the third inductive chip after transferred from the first inductive chip to the second inductive chip.

6. The device according to claim 1,
wherein data is transferred by a bucket-brigade system in which data is transferred from the second inductive chip to the first inductive chip after transferred from the third inductive chip to the second inductive chip.

7. The device according to claim 1, further comprising
a package board having first and second surfaces; and
bumps which is provided on the first surface of the package board,
wherein the first, second and third inductive chips are provided on the second surface of the package board.

8. The device according to claim 1,
wherein layouts of the transmitting inductors and the receiving inductors of the first, second and third inductive chips are the same.

* * * * *